United States Patent
Yu et al.

(10) Patent No.: US 8,519,409 B2
(45) Date of Patent: Aug. 27, 2013

(54) LIGHT EMITTING DIODE COMPONENTS INTEGRATED WITH THERMOELECTRIC DEVICES

(75) Inventors: Chih-Kuang Yu, Chiayi (TW); Hsing-Kuo Hsia, Jhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 360 days.

(21) Appl. No.: 12/946,453

(22) Filed: Nov. 15, 2010

(65) Prior Publication Data

US 2012/0119246 A1    May 17, 2012

(51) Int. Cl.
*H01L 29/15* (2006.01)

(52) U.S. Cl.
USPC ............. 257/77; 257/717; 257/719; 257/712; 257/720; 257/930

(58) Field of Classification Search
USPC ................... 257/77, E23.082, 930, 717, 719, 257/712, 720
See application file for complete search history.

(56) References Cited

U.S. PATENT DOCUMENTS

| | | | |
|---|---|---|---|
| 5,391,917 A | 2/1995 | Gilmour et al. |
| 5,510,298 A | 4/1996 | Redwine |
| 5,767,001 A | 6/1998 | Bertagnolli et al. |
| 5,998,292 A | 12/1999 | Black et al. |
| 6,184,060 B1 | 2/2001 | Siniaguine |
| 6,322,903 B1 | 11/2001 | Siniaguine et al. |
| 6,448,168 B1 | 9/2002 | Rao et al. |
| 6,465,892 B1 | 10/2002 | Suga |
| 6,472,293 B1 | 10/2002 | Suga |
| 6,538,333 B2 | 3/2003 | Kong |
| 6,599,778 B2 | 7/2003 | Pogge et al. |
| 6,639,303 B2 | 10/2003 | Siniaguine |
| 6,664,129 B2 | 12/2003 | Siniaguine |
| 6,693,361 B1 | 2/2004 | Siniaguine et al. |
| 6,740,582 B2 | 5/2004 | Siniaguine |
| 6,800,930 B2 | 10/2004 | Jackson et al. |
| 6,841,883 B1 | 1/2005 | Farnworth et al. |
| 6,882,030 B2 | 4/2005 | Siniaguine |
| 6,924,551 B2 | 8/2005 | Rumer et al. |
| 6,962,867 B2 | 11/2005 | Jackson et al. |
| 6,962,872 B2 | 11/2005 | Chudzik et al. |
| 7,030,481 B2 | 4/2006 | Chudzik et al. |
| 7,049,170 B2 | 5/2006 | Savastiouk et al. |
| 7,060,601 B2 | 6/2006 | Savastiouk et al. |
| 7,071,546 B2 | 7/2006 | Fey et al. |
| 7,111,149 B2 | 9/2006 | Eilert |
| 7,122,912 B2 | 10/2006 | Matsui |
| 7,157,787 B2 | 1/2007 | Kim et al. |

(Continued)

*Primary Examiner* — Jae Lee
(74) *Attorney, Agent, or Firm* — Haynes and Boone, LLP

(57) ABSTRACT

The present disclosure relates to structures of LED components that integrate thermoelectric devices with LEDs on LED emitter substrates for cooling the LEDs. The present disclosure also related to methods for integrating LED dies with thermoelectric elements. The LED component includes an LED emitter substrate with a cavity in a downward facing surface of the LED emitter substrate and thermal vias that extend from a bottom of the cavity to an area close to an upward facing surface of the LED emitter substrate. The device also includes thermoelectric elements disposed in the cavity where the thermoelectric elements connect with their corresponding thermal vias. The device further includes a thermoelectric substrate in the cavity to electrically connect to the thermoelectric elements. The device further includes an LED die on the upward facing surface of the LED emitter substrate such that the LED die is opposite the cavity.

20 Claims, 17 Drawing Sheets

(56) References Cited

U.S. PATENT DOCUMENTS

| | | |
|---|---|---|
| 7,193,308 B2 | 3/2007 | Matsui |
| 7,262,495 B2 | 8/2007 | Chen et al. |
| 7,297,574 B2 | 11/2007 | Thomas et al. |
| 7,335,972 B2 | 2/2008 | Chanchani |
| 7,355,273 B2 | 4/2008 | Jackson et al. |
| 7,633,093 B2 * | 12/2009 | Blonder et al. ............ 257/81 |
| 2010/0117113 A1 * | 5/2010 | Lu et al. ............ 257/99 |

* cited by examiner

LIGHT EMITTING DIODE COMPONENTS INTEGRATED WITH THERMOELECTRIC DEVICES

BACKGROUND

Light emitting diodes (LEDs) emit light when voltages are applied across their P/N junctions. Characteristics of LEDs such as their optical performance and operating life are a function of temperature across the P/N junctions. For example, a wavelength of emitted light changes as the junction temperature rises. Accordingly, LEDs and their junction temperature are cooled to optimize the optical performance of the LEDs. Traditional methods of LED cooling include using passive cooling devices such as heat slugs or heat sinks to dissipate heat. These methods rely on either cooling of LED heat source using heat conduction through devices having a lower thermal resistance to other parts of the LED, or using heat convection from the heat source or the passive cooling devices to ambient air.

While passive cooling devices are widely used to cool LEDs, the efficiency of heat transfer using these devices has not been entirely satisfactory. For example, the amount of heat transfer in convective heating is a function of the temperature difference between the heat source and the ambient air. As the ambient air temperature heats up from the convective heating, the efficiency of heat transfer decreases. In addition, in conductive heating, semiconductor materials and other materials used to provide the thermal path in the LEDs may have poor thermal conductivity, resulting in poor heat conduction. Furthermore, it is difficult to control the junction temperature of LEDs within a desirable range for optimum optical performance when passive cooling devices are used. Accordingly, there is a need for methods of LED cooling that have high heat transfer efficiency while allowing the junction temperature of LEDs to be more accurately controlled.

BRIEF DESCRIPTION OF THE DRAWINGS

Embodiments of the present disclosure and their advantages are best understood by referring to the detailed description that follows. It should be appreciated that like reference numerals are used to identify like elements illustrated in one or more of the figures.

DETAILED DESCRIPTION

Figure 1:
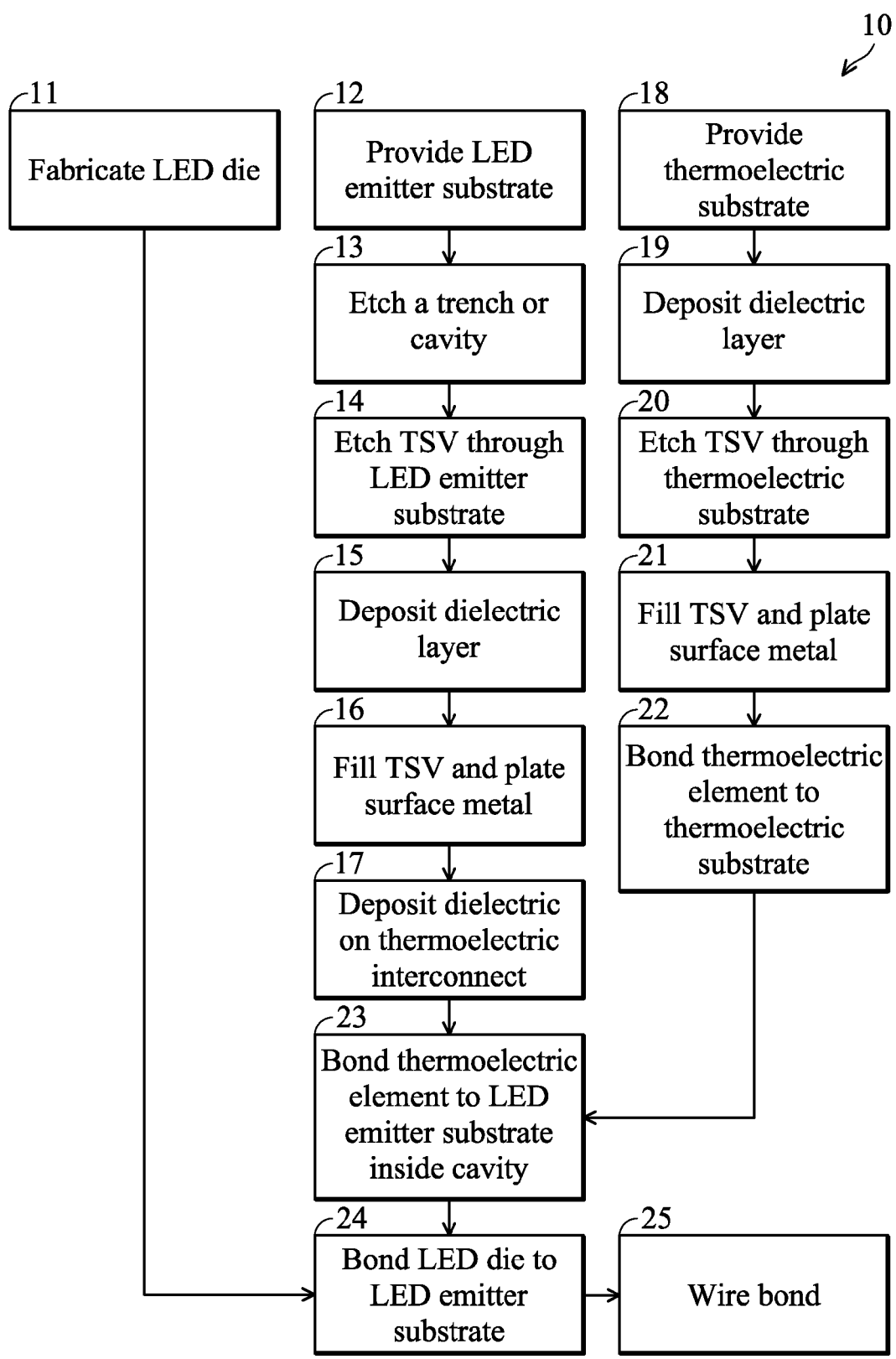
FIG. 1 shows a flowchart of a method for fabricating a semiconductor LED component with an integrated thermoelectric device according to one or more embodiments of the present disclosure.

It is understood that the present disclosure provides many different forms and embodiments, and that specific embodiments are provided only as examples. Further, the scope of the present disclosure will only be defined by the appended claims. In the drawings, the sizes and relative sizes of layers and regions may be exaggerated for clarity. It will be understood that when an element or layer is referred to as being "on," or "coupled to" another element or layer, it may be directly on, or coupled to the other element or layer, or intervening elements or layers may be present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein may likewise be interpreted accordingly.

Hereinafter, embodiments of the present invention will be explained in detail with reference to the accompanying drawings.

FIG. 1 shows a flowchart of a method 10 for fabricating a semiconductor LED component with an integrated thermoelectric device according to one or more embodiments of the present disclosure. Method 10 integrates an LED die bonded on an LED emitter substrate with thermoelectric elements bonded to a thermoelectric substrate. The thermoelectric elements and the thermoelectric substrate are positioned in a trench or cavity etched in the downward facing surface of the LED emitter substrate. The LED die is bonded to the upward facing surface of the LED emitter substrate opposite the thermoelectric elements in the trench or cavity. Heat from the LED die is carried away by the thermoelectric elements through thermal vias in the LED emitter substrate to facilitate cooling of the LED die. Method 10 is explained with reference to integrating gallium nitride (GaN) LEDs with thermoelectric elements using a silicon substrate as the LED emitter substrate. Alternatively, method 10 may be applied to LEDs or emitter substrates of different materials.

In step 11, epitaxial layers for fabricating the LED die are deposited on a wafer of growth substrate having a lattice structure similar to the lattice structure of the LED material. In the present embodiment, the epitaxial layers are made of gallium nitride (GaN). In alternative embodiments, epitaxial layers of other materials are used. The epitaxial layers may be deposited by processes such as metal organic chemical vapor deposition (MOCVD) or other deposition processes. The deposited epitaxial layers may include an n-doped GaN layer (n-GaN), a multiple quantum well (MQW) active layer, a p-doped GaN layer (p-GaN), and a p-contact metal layer. LED dies may have different configurations and different processing steps depending on how the n-doped layer is electrically accessed. For example, in a vertical GaN LED, p-contacts and n-contacts for electrically accessing the p-GaN layer and the n-GaN layer of the LED are located on opposite sides of the LED. In a face-up LED where contact metallization for the p-GaN layer and the n-GaN layer are both on the top side of the LED, portions of the p-GaN layer and the active layer are etched to expose the n-GaN layer for forming an n-contact metallization.

Figure 1A:
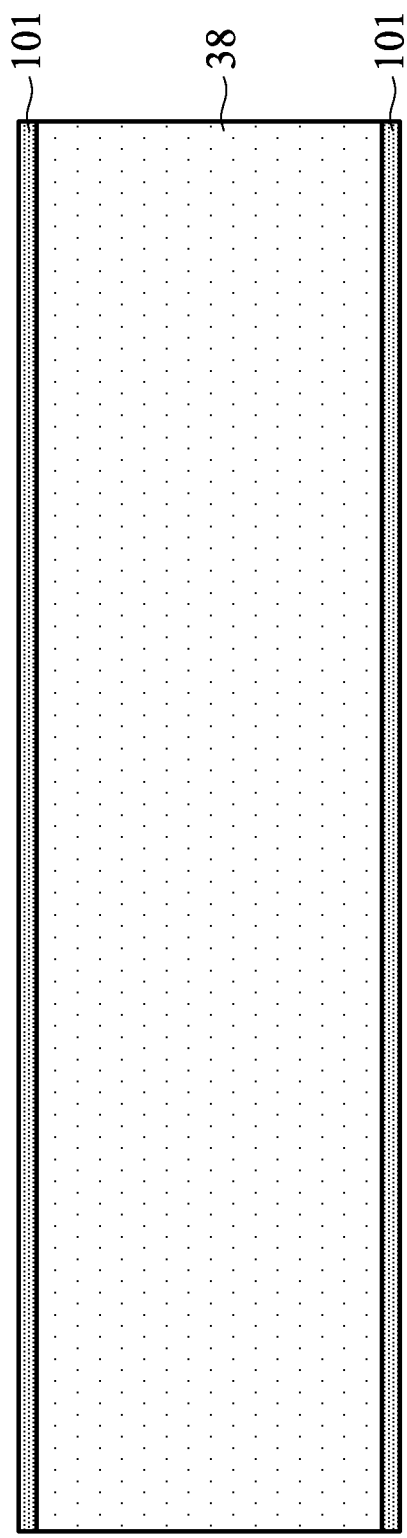
FIG. 1A shows a cross-sectional view of a silicon substrate after deposition of a wet etch barrier according to one or more embodiments of the present disclosure.

In step 12, an LED emitter substrate is provided. In the present embodiment, the LED emitter substrate is a silicon substrate. In alternative embodiments, the LED emitter substrate may include other semiconductor materials. The silicon substrate has high thermal conductivity to improve thermal dissipation of the LED die that will be bonded to the upward facing surface of the silicon substrate. The silicon substrate will be deposited with a p-electrode and an n-electrode for connecting to the p-contact and the n-contact of the epitaxial layers of the LED die. In addition, the silicon substrate will be deposited with bonding areas for bonding to the LED die and to the thermoelectric elements. The bonding area for bonding to the LED die may be an extension of one of the p-electrode and n-electrode. In addition, the silicon substrate will be etched through a wet etch process or a dry etch process to form a trench or cavity for bonding to the thermoelectric elements FIG. 1A shows a cross-sectional view of a silicon substrate after deposition of a wet etch barrier according to one or more embodiments of the present disclosure. To prepare a silicon substrate 38 for wet etching a trench or cavity in the downward facing surface of silicon substrate 38, a wet etch barrier layer 101 is first deposited on both surfaces of silicon substrate 38.

Figure 1B:
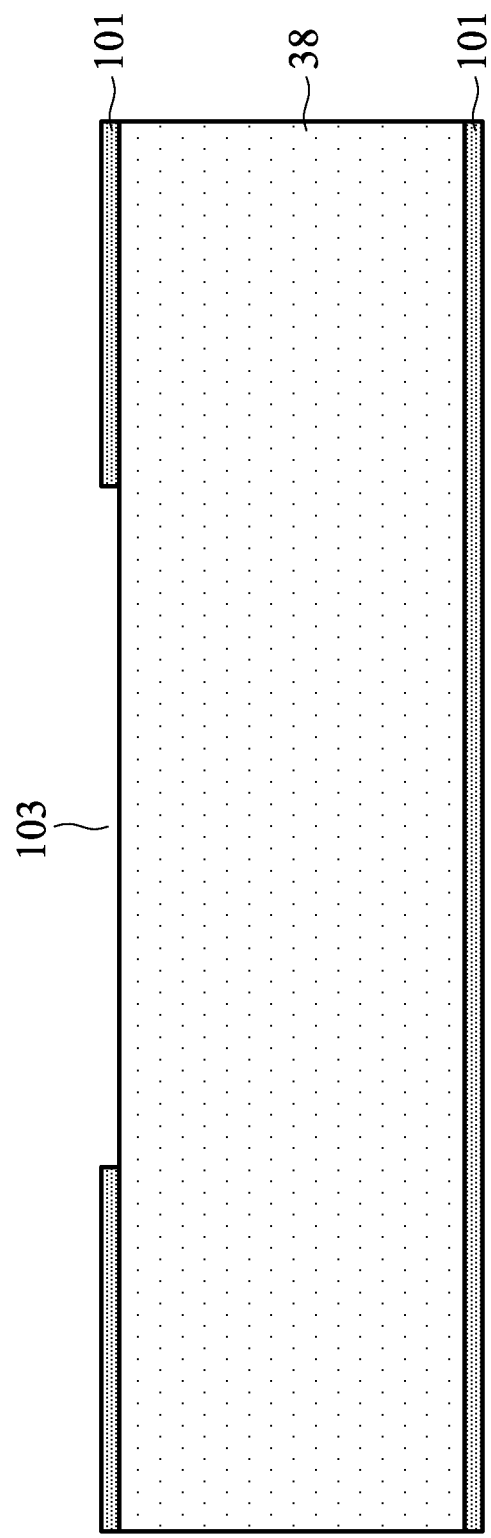
FIG. 1B shows a cross-sectional view of a silicon substrate with an opening in the wet etch barrier layer according to one or more embodiments of the present disclosure.

FIG. 1B shows a cross-sectional view of a silicon substrate with an opening in the wet etch barrier layer according to one or more embodiments of the present disclosure. Using a photolithography process, an opening 103 is made through wet etch barrier layer 101 on one surface of silicon substrate 38 in an area where a cavity is to be etched into silicon substrate 38. The cavity defines an area for integrating the thermoelectric elements and the thermoelectric substrate to silicon substrate 38. The surface of silicon substrate 38 into which the cavity is etched is referred to as the downward facing surface of silicon substrate 38. The other surface is referred to as the upward facing surface of silicon substrate 38.

Referring back to FIG. 1, in step 13, a trench or cavity is etched into the downward facing surface of the silicon substrate using an etching process. The etching process may be a wet etch process for forming a cavity with sloping sidewalls. Alternatively, the etching process may be a dry etch process for forming a cavity with vertical sidewalls.

Figure 1C:
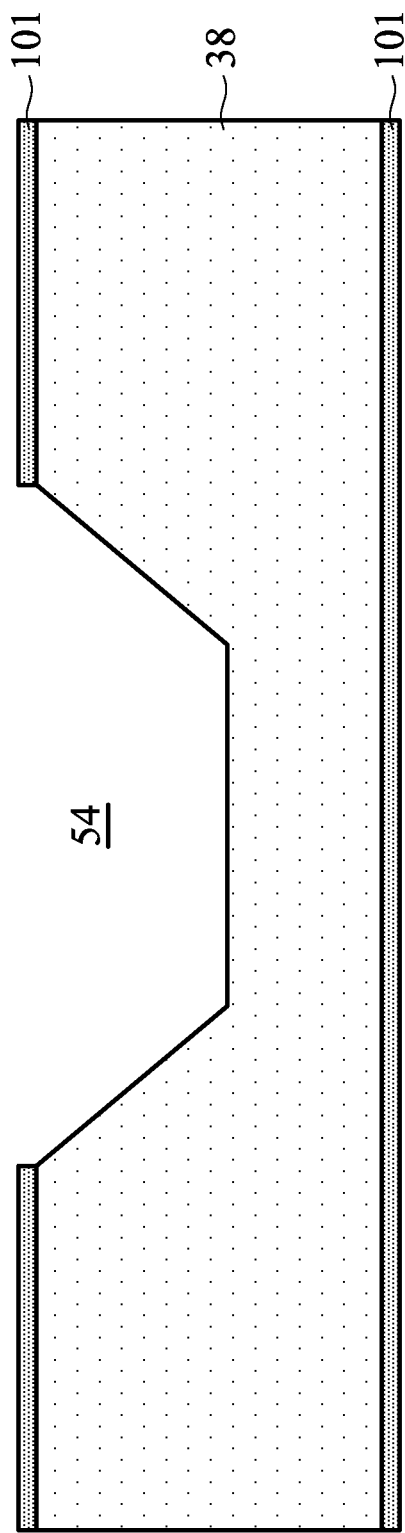
FIG. 1C shows a cross-sectional view of a silicon substrate with a cavity formed by a wet etch process according to one or more embodiments of the present disclosure.
Figure 1D:
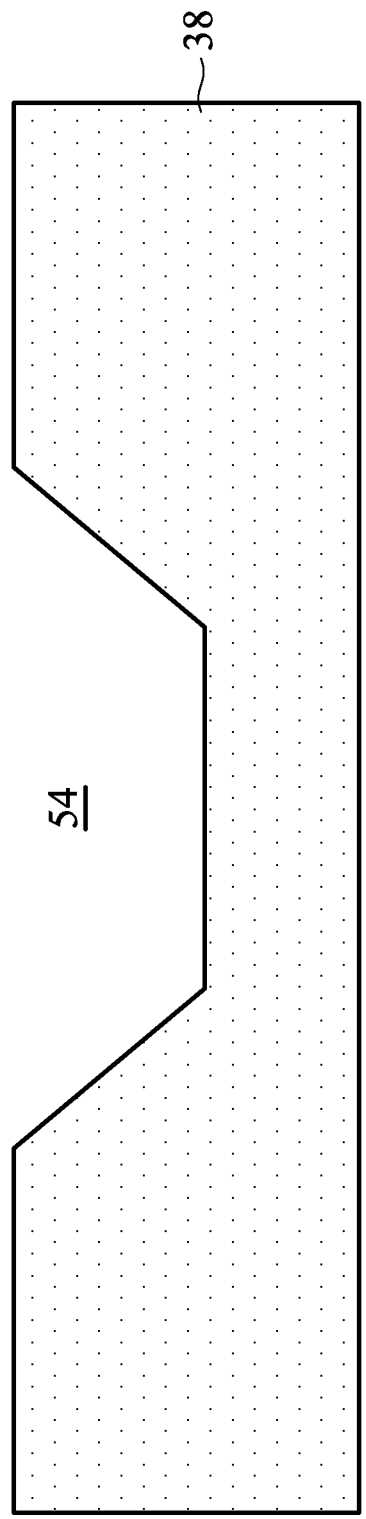
FIG. 1D shows a cross-sectional view of a silicon substrate with a cavity after step 13 of FIG. 1 according to one or more embodiments of the present disclosure.

FIG. 1C shows a cross-sectional view of a silicon substrate with a cavity formed by a wet etch process according to one or more embodiments of the present disclosure. A cavity 54 is etched into a surface of silicon substrate 38 to create a space for positioning the thermoelectric elements and the thermoelectric substrate used to support the thermoelectric elements. Cavity 54 is sufficiently deep to allow the thermoelectric elements to be located as close as possible to the LED die to be bonded to the upward facing surface of silicon substrate 38 for more effective cooling of the LED die. However, cavity 54 may not be too deep so as to avoid weakening the structural integrity of silicon substrate 38. Accordingly, in the present embodiment, areas of silicon substrate 38 remain between the bottom of cavity 54 and the upward facing surface where the LED die is to be bonded. After the wet etching process, the wet etch barrier layer from both surfaces of the silicon substrate is removed. FIG. 1D shows a cross-sectional view of a silicon substrate with a cavity after step 13 of FIG. 1 according to one or more embodiments of the present disclosure.

Referring back to FIG. 1, in step 14, vias are etched in the silicon substrate for forming through-silicon vias (TSVs) using an etching process such as dry etching. Alternatively, vias may be formed in the silicon substrate using laser drilling. The TSVs may be thermal TSVs between the bottom of the trench or cavity and the upward facing surface of the silicon substrate close to where the LED die is to be bonded. The end of a thermal TSV at the bottom of the cavity connects to a thermal element positioned in the cavity. The other end of the thermal TSV at the upper facing surface of the silicon substrate may connect to another thermal TSV through a metal interconnect. The thermal TSVs act as an extension of the thermoelectric elements to channel heat away from the LED die to the thermoelectric elements. In addition, the metallic interconnect between two thermal TSVs electrically connect the pair of thermal TSVs. Each pair of thermal TSVs may connect to a p-type and an n-type thermoelectric element. When power is applied to the thermoelectric elements to positively bias the n-type thermoelectric element relative to the p-type thermoelectric element, electrons of the n-type thermoelectric element and holes of the p-type thermoelectric element move through the thermal TSVs in the direction from the LED die toward the thermoelectric elements. The direction of the flow of the charge carriers removes heat from the LED die. Since electrons in the n-type thermoelectric element move in the opposite direction from the direction of the current, and holes in the p-type thermoelectric element move in the same direction as the direction of the current, the metallic interconnects between each pair of n-type and p-type thermoelectric elements provide a conductive path for the current to move from the n-type thermoelectric element to the p-type thermoelectric element.

In addition to the thermal TSVs, there may also be electrical TSVs between the downward facing surface and the upward facing surface of the silicon substrate in areas of the silicon substrate other than the cavity. The electrical TSVs provide electrical paths for supplying power from the downward facing surface of the silicon substrate to the LED die disposed on the upward facing surface.

Figure 1E:
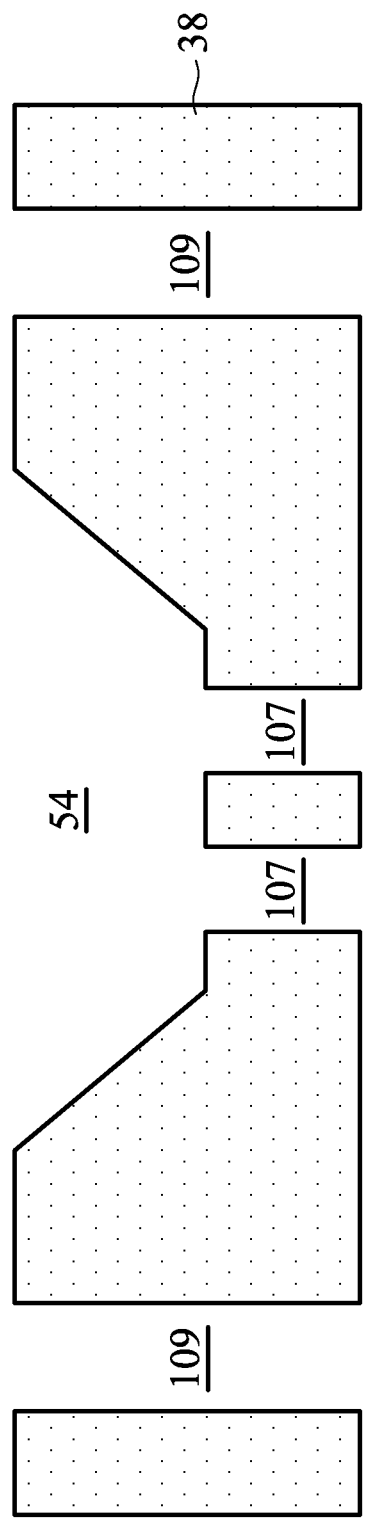
FIG. 1E shows a cross-sectional view of a silicon substrate etched with thermal and electrical TSVs after step 14 of FIG. 1 according to one or more embodiments of the present disclosure.

FIG. 1E shows a cross-sectional view of a silicon substrate etched with thermal and electrical TSVs after step 14 of FIG. 1 according to one or more embodiments of the present disclosure. Thermal TSVs 107 are formed between the bottom of cavity 54 and the upward facing surface of silicon substrate 38. In addition, electrical TSVs 109 are formed between the two surfaces of silicon substrate 38 in areas of silicon substrate 38 other than the cavity 54.

Referring back to FIG. 1, in step 15, a dielectric layer such as $SiO_2$ is deposited on both the upward and downward facing surfaces of the silicon substrate and also on the walls of the TSVs. Alternatively, the dielectric layer may be made of silicon nitrite ($Si_3N_4$), or silicon carbide, (SiC). Deposit of the dielectric layer may be through a chemical vapor deposition process. The dielectric layer electrically isolates metal layer of the TSVs from the silicon substrate and also prevents diffusion of the metal layer into the silicon substrate.

Figure 1F:
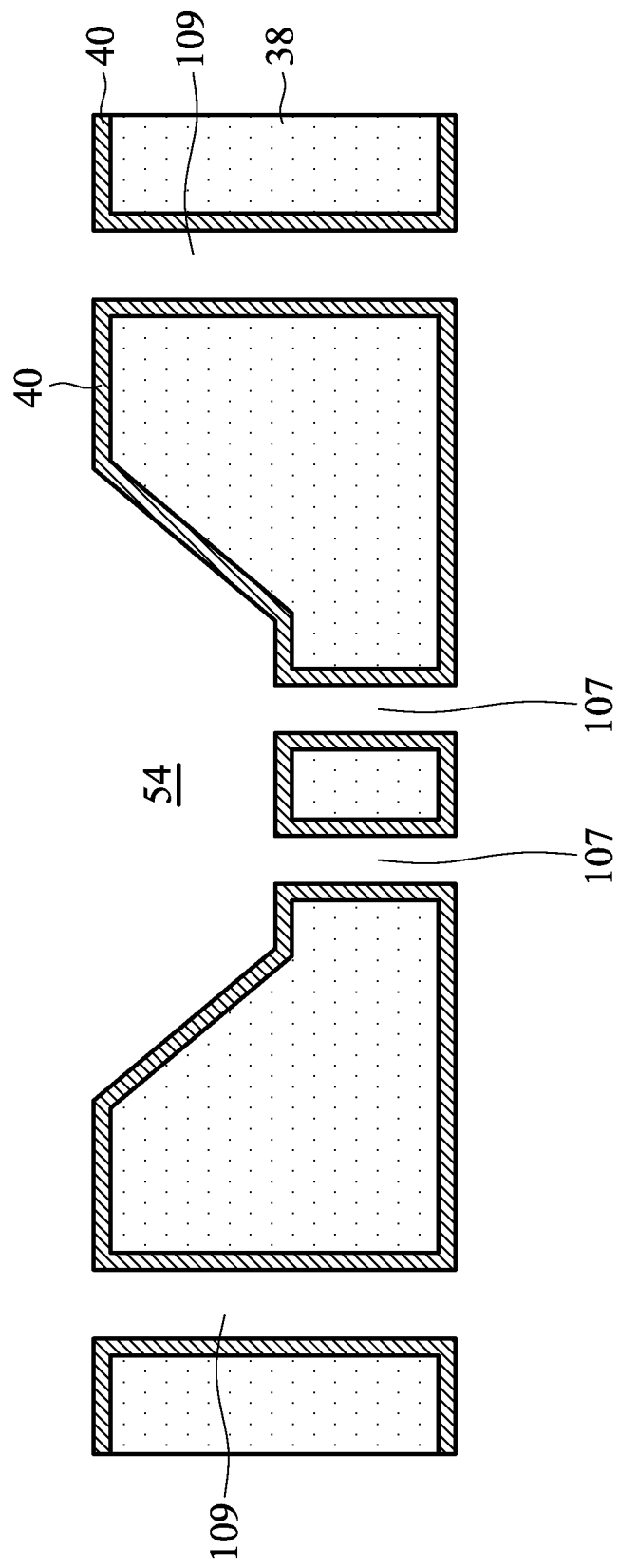
FIG. 1F shows a cross-sectional view of a silicon substrate with a dielectric layer after step 15 of FIG. 1 according to one or more embodiments of the present disclosure.

FIG. 1F shows a cross-sectional view of a silicon substrate with a dielectric layer after step 15 of FIG. 1 according to one or more embodiments of the present disclosure. A dielectric layer 40 is deposited on the inside wall surfaces of thermal TSVs 107 and electrical TSVs 109, and also on both surfaces of silicon substrate 38.

Referring back to FIG. 1, in step 16, a photolithography process is used to define openings for metal plating of the TSVs and a metal layer is deposited over the dielectric layer to form surface metal plating for the TSVs. The metal layer also fills the TSVs to complete the fabrication of the TSVs. In addition, metal interconnects are formed between pairs of thermal TSVs at their upward facing surface.

Figure 1G:
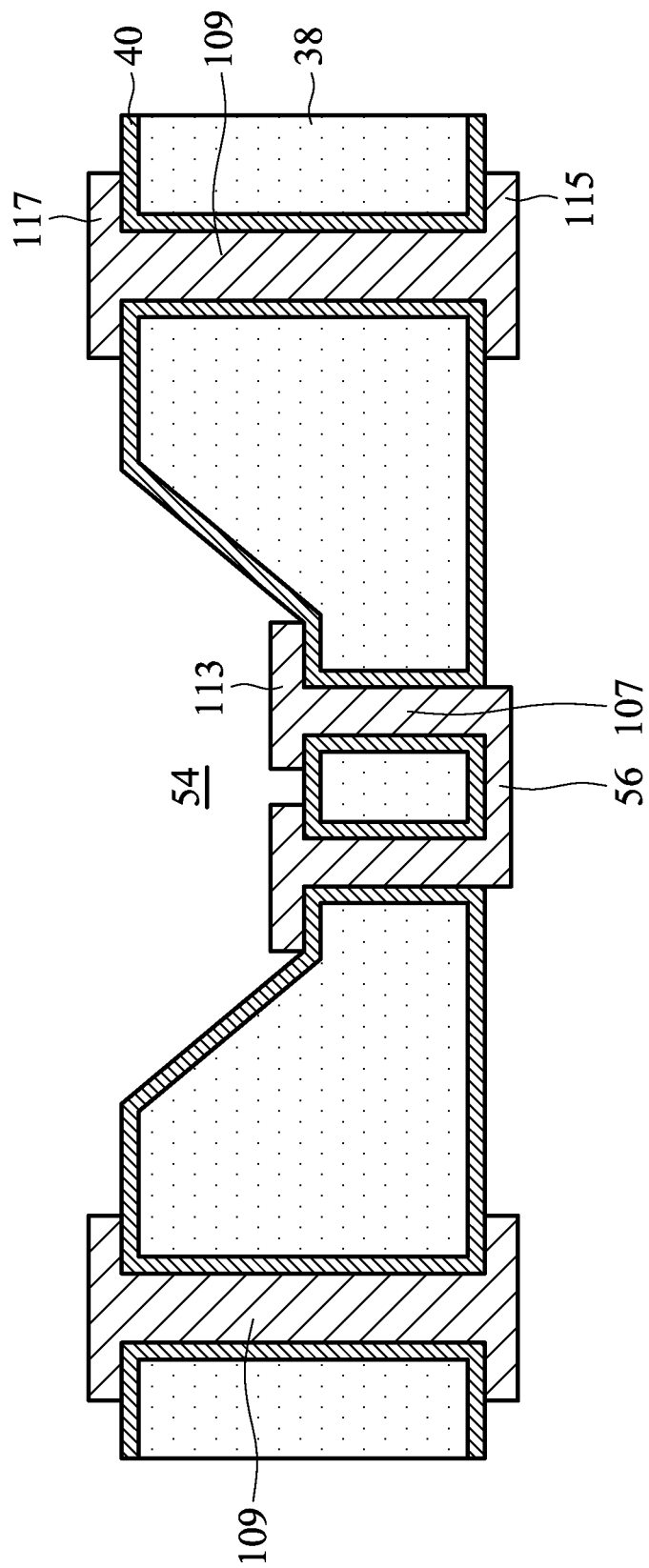
FIG. 1G shows a cross-sectional view of a silicon substrate after metal plating of the TSVs performed in step 16 of FIG. 1 according to one or more embodiments of the present disclosure.

FIG. 1G shows a cross-sectional view of a silicon substrate after metal plating of the TSVs performed in step 16 of FIG. 1 according to one or more embodiments of the present disclosure. At the downward facing surface of each thermal TSVs 107, a surface metal plating 113 is formed at the bottom of the cavity 54 for bonding to their respective thermoelectric elements. At the upward facing surface of thermal TSVs 107, a metal interconnect 56 is disposed to form a bridge between the two thermal TSVs 107. The two thermal TSVs 107 may be bonded to a p-type thermal element and an n-type thermal element. Thus, metal interconnect 56 connects in series a pair of p-type and n-type thermal elements. In addition, electrical TSVs 109 have surface metal plating 115 on the upward facing surface of silicon substrate 38 to form contact areas for electrically connecting to the LED die. On the downward facing surface of electrical TSVs 109, surface metal plating 117 is formed to provide electrodes for connecting to power supplied from package pins or for connecting to other devices.

Referring back to FIG. 1, in step 17, a second dielectric layer such as $SiO_2$ is deposited on the upward facing surface of the silicon substrate and patterned through a photolithography process to cover the metal interconnect between pairs of thermal TSVs. In addition, to electrically connect to a vertical LED die, a photolithography process may be used to define an area over the second dielectric layer and a surface metal plating on the upward facing surface of an electric TSV. A second metal layer is deposited over the defined area on the upward facing surface of the silicon substrate to form a secondary surface metal plating for bonding to the vertical LED die.

Figure 1H:
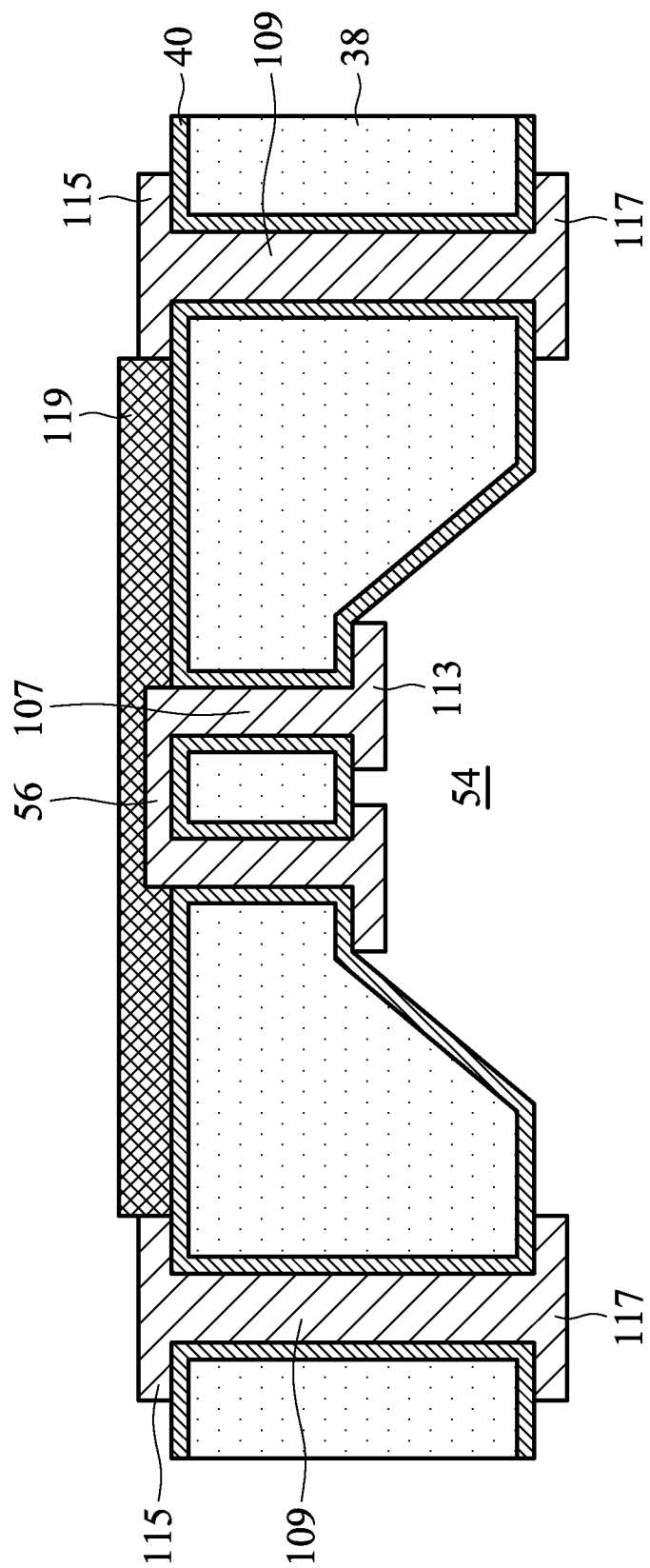
FIG. 1H shows a cross-sectional view of a silicon substrate after deposition of a second dielectric layer to cover a metal interconnect between a pair of thermal TSVs performed in step 17 of FIG. 1 according to one or more embodiments of the present disclosure.

FIG. 1H shows a cross-sectional view of a silicon substrate after deposition of a second dielectric layer to cover a metal interconnect between a pair of thermal TSVs performed in step 17 of FIG. 1 according to one or more embodiments of the present disclosure. Second dielectric layer 119 electrically isolates metal interconnect 56 from the LED die that will be bonded to the upward facing surface of silicon substrate 38. Second dielectric layer 119 is also extended to cover first dielectric layer 40 between surface metal plating 115 of two electrical TSVs 109 on the upward facing surface of silicon substrate 38. Second dielectric layer 119 may be made of the same material as first dielectric layer 40 and may be treated as an extension of first dielectric layer 40

Figure 1I:
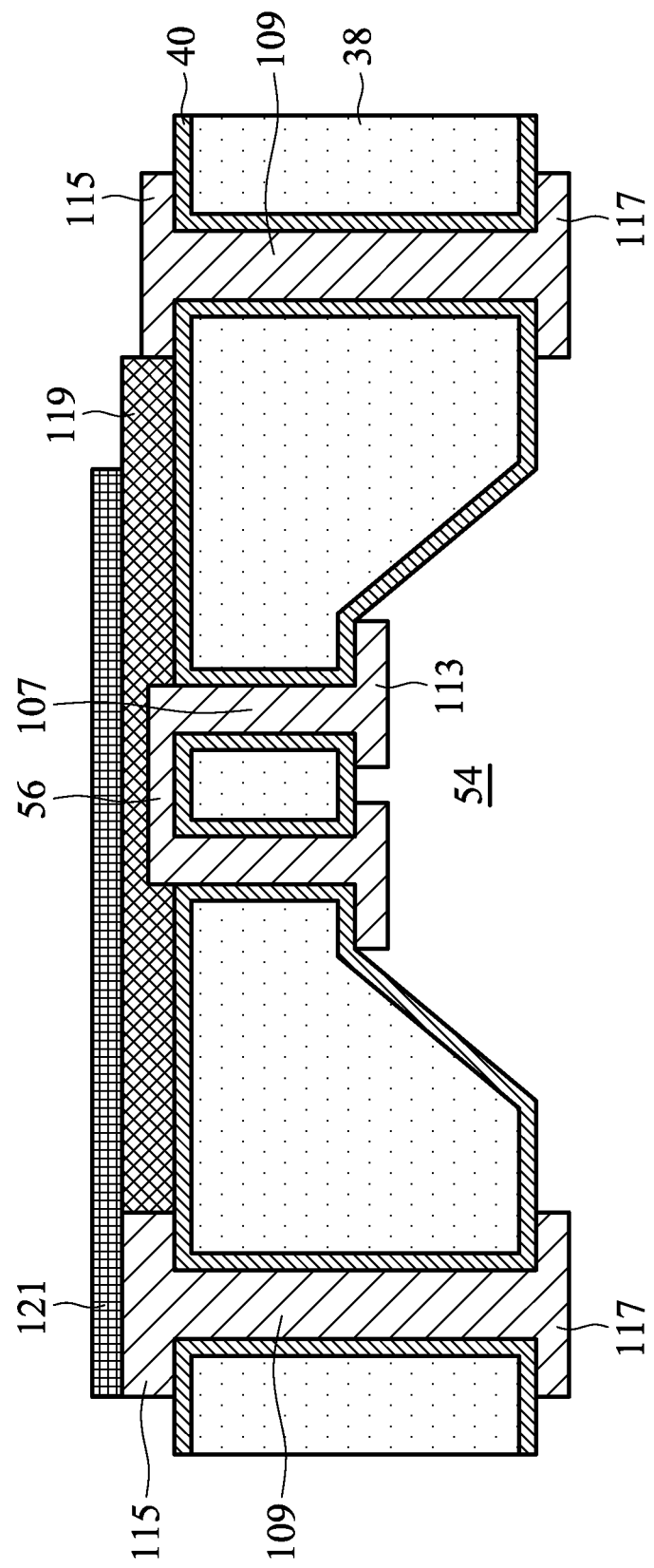
FIG. 1I shows a cross-sectional view of a silicon substrate after deposition of a second metal layer to form a secondary surface metal plating performed in step 17 of FIG. 1 according to one or more embodiments of the present disclosure.

FIG. 1I shows a cross-sectional view of a silicon substrate after deposition of a second metal layer to form a secondary surface metal plating performed in step 17 of FIG. 1 according to one or more embodiments of the present disclosure. To electrically connect to a vertical LED die, a secondary surface metal plating 121 is deposited over surface metal plating 115 of electrical TSV 109 and over second dielectric layer 119 on the upward facing surface of silicon substrate 38. Secondary surface metal plating 121 serves as a contact for bonding an LED die to the upward facing surface of silicon substrate 38. Secondary surface metal plating 121 also electrically connects to surface metal plating 115 of electrical TSV 109 to supply power to the LED die. In addition, secondary surface metal plating 121 may also serve as a thermal contact to conduct heat away from the LED die. Secondary surface metal plating 121 may be made of the same metal as surface metal plating 115 and may be treated as an extension of surface metal plating 115.

Thus, an LED emitter substrate such as silicon substrate 38 is fabricated to include a bonding area made of a secondary surface metal plating 121 on the upward facing surface of the LED emitter substrate for bonding to an LED die. The LED emitter substrate also has cavity 54 on the downward facing surface of the LED emitter substrate. Thermal TSVs 107 between the bottom of cavity 54 and the upward facing surface of the LED emitter substrate channel heat from the LED die to thermoelectric elements. Thermal TSVs 107 also provide surface metal plating 113 as bonding areas for bonding to the thermoelectric elements positioned in cavity 54. In addition, electrical TSVs 109 are disposed in the LED emitter substrate for supplying power to the LED die. Other microelectronic devices and supporting circuitries may also be formed in the LED emitter substrate to electrically connect the LED die to other devices or to external package pins.

Referring back to FIG. 1, in step 18, a thermoelectric substrate is provided. The thermoelectric substrate may have a similar structure as the LED emitter substrate. In the present embodiment, the thermoelectric substrate is a silicon substrate. In alternative embodiments, the thermoelectric substrate may include other semiconductor materials. The thermoelectric substrate provides a substrate for bonding thermoelectric elements and will be disposed with TSVs to provide both electrical connections and heat dissipation channels for the thermoelectric elements.

In step 19, a dielectric layer such as $SiO_2$ is deposited on both surfaces of the thermoelectric substrate. Deposit of the dielectric layer may be through a chemical vapor deposition process. The dielectric layer electrically isolates metal surface plating that will be deposited for the TSVs from the thermoelectric substrate and also prevents diffusion of the metal layer into the thermoelectric substrate.

Figure 1J:
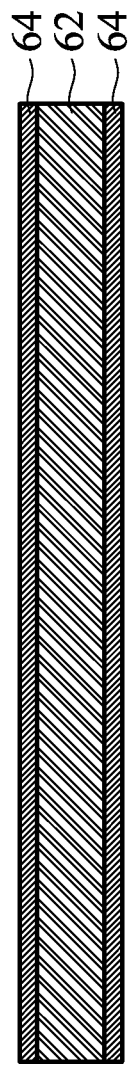
FIG. 1J shows a cross-sectional view of a thermoelectric substrate with deposition of a dielectric layer after step 18 of FIG. 1 according to one or more embodiments of the present disclosure.

FIG. 1J shows a cross-sectional view of a thermoelectric substrate with deposition of a dielectric layer after step 18 of FIG. 1 according to one or more embodiments of the present disclosure. A dielectric layer 64 is deposited on both surfaces of a silicon substrate 62 of a thermoelectric substrate.

Referring back to FIG. 1, in step 20, vias are etched in the thermoelectric substrate and the dielectric layer for forming TSVs using an etching process such as dry etching. Alternatively, vias may be formed in the thermoelectric substrate using laser drilling. The TSVs may be thermal TSVs that bond with the thermoelectric elements disposed on one side of the thermoelectric substrate to conduct heat from the thermoelectric elements to the other side of the thermoelectric substrate. On the other side of the thermoelectric substrate, the thermal TSVs may open to the ambient air for convective cooling or may be connected with a heat sink for conductive cooling. In addition, surface metal plating of the thermal TSVs for bonding to the thermoelectric elements may act as a thermoelectric interconnect between the n-type thermoelectric element of a first thermoelectric pair and the p-type thermoelectric element of an adjacent thermoelectric pair. In this way, pairs of thermoelectric elements may be connected in series for enhanced cooling of the LED die.

In addition to the thermal TSVs, there are also electrical TSVs between the two sides of the thermoelectric substrate for supplying power to the thermoelectric elements from electrodes disposed on the side of the thermoelectric substrate not having the thermoelectric elements.

Figure 1K:
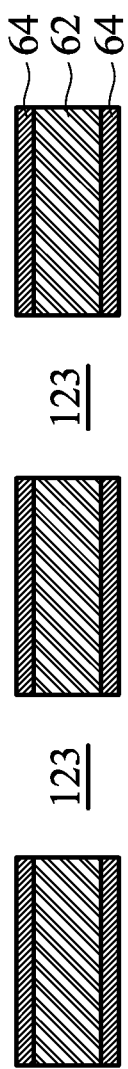
FIG. 1K shows a cross-sectional view of a thermoelectric substrate etched with electrical TSVs after step 20 of FIG. 1 according to one or more embodiments of the present disclosure.

FIG. 1K shows a cross-sectional view of a thermoelectric substrate etched with electrical TSVs after step 20 of FIG. 1 according to one or more embodiments of the present disclosure. Electrical TSVs 123 are formed between the two surfaces of the thermoelectric substrate that includes dielectric layer 64 and silicon substrate 62.

Referring back to FIG. 1, in step 21, a metal layer is deposited over the dielectric layer to form surface metal plating for the TSVs. The metal layer also fills the TSVs to complete the fabrication of the TSVs. To form the surface metal plating and to fill the TSVs, a barrier layer such as titanium may be deposited on the dielectric layer and a seed metal layer such as copper may be deposited on the barrier layer. A photoresist layer may be laminated on the seed metal layer and patterned in a photo-lithography process to define areas for the surface metal plate. A metal layer such as copper may then be deposited through metal plating over the seed metal layer to form the surface metal plating for the TSVs and to fill the via openings.

Figure 1L:
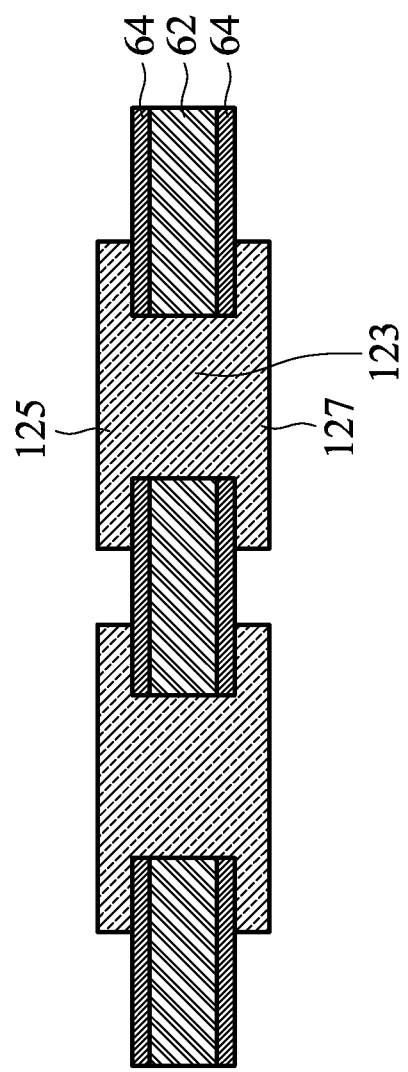
FIG. 1L shows a cross-sectional view of a thermoelectric substrate after metal plating of the TSVs performed in step 21 of FIG. 1 according to one or more embodiments of the present disclosure.

FIG. 1L shows a cross-sectional view of a thermoelectric substrate after metal plating of the TSVs performed in step 21 of FIG. 1 according to one or more embodiments of the present disclosure. On one side of the thermoelectric substrate, electrical TSVs 123 have surface metal plating 125 to form contact areas for bonding to and electrically connecting with thermoelectric elements. On the other side of the thermoelectric substrate, surface metal plating 127 of electrical TSVs 123 provides electrodes for connecting the thermoelectric elements to power supplies.

Referring back to FIG. 1, in step 22, thermoelectric elements are bonded to the thermoelectric substrate through the surface metal plating of thermal TSVs and electrical TSVs. The thermoelectric elements include alternating p-type and n-type semiconductor elements arranged in pairs. The side of the thermoelectric elements bonded to the thermoelectric substrate is referred to as the hot end of the thermoelectric element because the thermoelectric elements are electrically biased to transfer heat to this end. Bonding of the thermoelectric elements to the thermoelectric substrate may be performed by a soldering process.

Figure 1M:
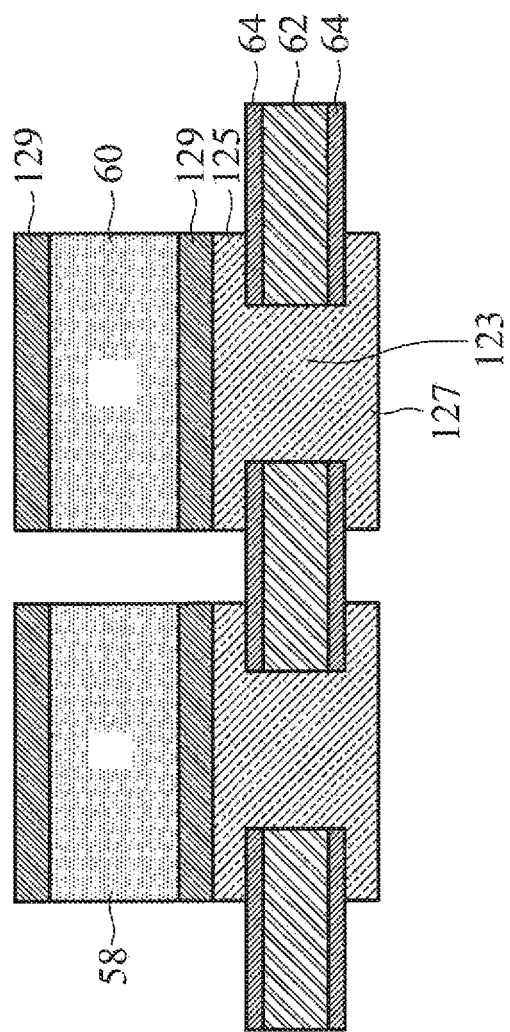
FIG. 1M shows a cross-sectional view of a pair of thermoelectric elements bonded to a thermoelectric substrate after step 22 of FIG. 1 according to one or more embodiments of the present disclosure.

FIG. 1M shows a cross-sectional view of a pair of thermoelectric elements bonded to a thermoelectric substrate after step 22 of FIG. 1 according to one or more embodiments of the present disclosure. A pair of thermoelectric elements including a p-type thermoelectric element 58 and an n-type thermoelectric element 60 is bonded to surface metal plating 125 of electrical TSVs 123 of the thermoelectric substrate through a solder layer 129. Another solder layer 129 is deposited on the side of p-type thermoelectric element 58 and n-type thermoelectric element 60 not bonded to the thermoelectric substrate. This solder layer will be used to bond the thermoelectric elements to the LED emitter substrate.

Referring back to FIG. 1, in step 23, the thermoelectric elements and the thermoelectric substrate are positioned at the bottom of the trench or cavity of the LED emitter substrate so that the end of the thermoelectric elements not bonded to the thermoelectric substrate is bonded to the thermal TSVs of the LED emitter substrate. The side of the thermoelectric elements bonded to the thermal TSVs of the LED emitter substrate is referred to as the cold end of the thermoelectric elements because the thermoelectric elements are biased to remove heat from this side to the hot end.

Figure 1N:
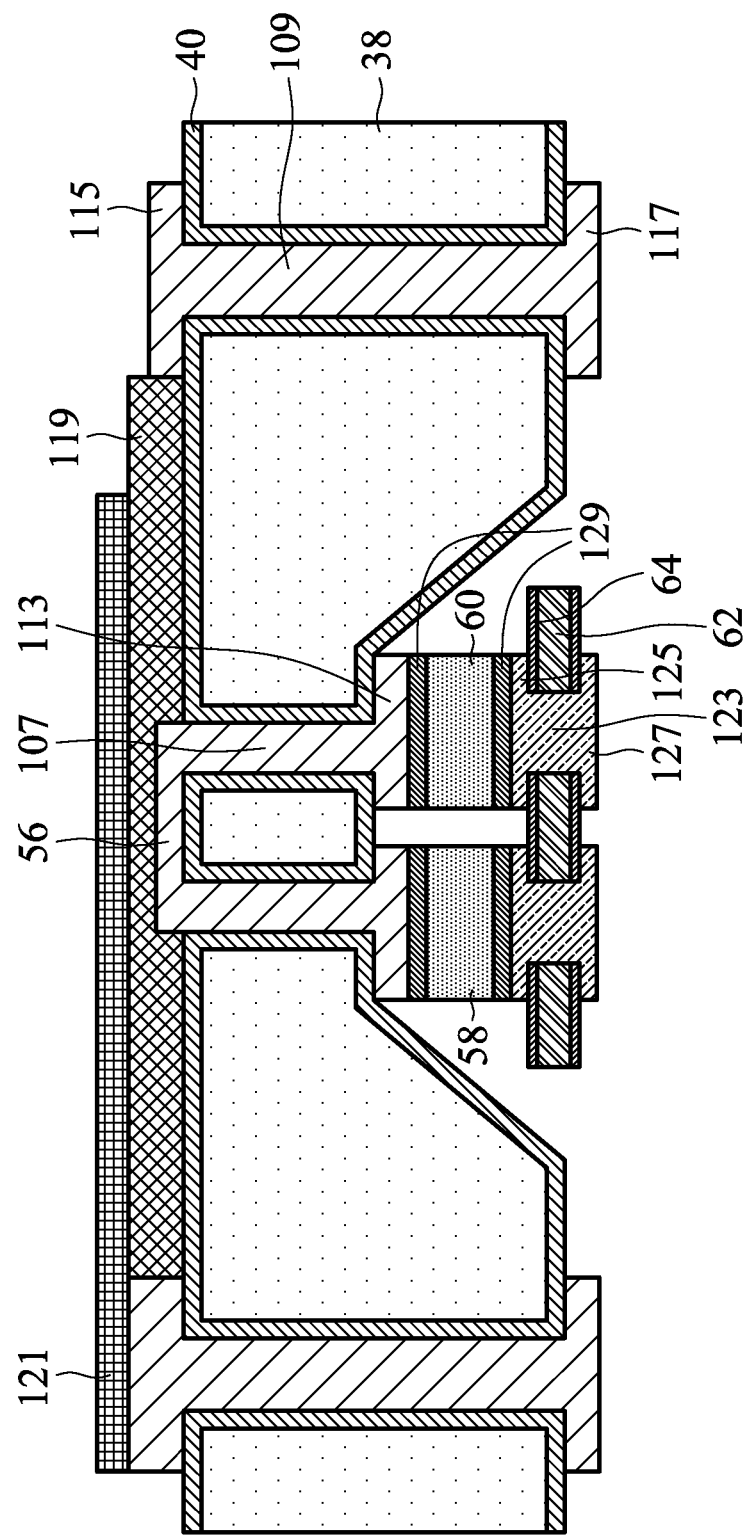
FIG. 1N shows a cross-sectional view of thermoelectric elements of a thermoelectric substrate bonded to the LED emitter substrate in the cavity of the LED emitter substrate according to one or more embodiments of the present disclosure.

FIG. 1N shows a cross-sectional view of thermoelectric elements of a thermoelectric substrate bonded to the LED emitter substrate in the cavity of the LED emitter substrate according to one or more embodiments of the present disclosure. P-type thermoelectric element 58 and n-type thermoelectric element 60 on the thermoelectric substrate are bonded to surface metal plating 113 of thermal TSVs 107 of the LED emitter substrate through a solder layer 129. At the upward facing surface of thermal TSVs 107, metal interconnect 56 forms a bridge between the two thermal TSVs 107 to connect the pair of p-type thermoelectric element 58 and n-type thermoelectric element 60 in series. Electrical TSVs 123 of the thermoelectric substrate supply power to the thermoelectric elements from power supplies connected to surface metal plating 127 of electrical TSVs 123 from the downward facing surface of the thermoelectric substrate. Electrical TSVs 123 also channel heat away from the hot end of the thermoelectric elements.

Referring back to FIG. 1, in step 24, the LED die from step 11 is bonded to the upward facing surface of the LED emitter substrate opposite the trench or cavity containing the thermoelectric elements. The LED die may be bonded to the secondary surface metal plating of the LED emitter substrate where the secondary surface metal plating also has a reflective layer to reflect upward light from the active layer of the LED die.

For a vertical GaN LED die, bonding to the LED emitter substrate may be through the p-GaN layer or through a heavily doped silicon wafer that is connected to the p-GaN layer. Bonding of the vertical GaN LED die to the secondary surface metal plating of the LED emitter substrate also electrically connects the p-GaN layer. The growth substrate of the vertical LED die may be removed to improve thermal dissipation because the growth substrate typically has low thermal conductivity. For a sapphire growth substrate, removal may be by means of a laser lift-off (LLO) technique. For a silicon-based growth substrate, removal may be by means of dry or wet etching techniques. Alternatively, the growth substrate may be grinded and polished to reduce its thickness. Removal of the growth substrate from the LED die exposes the n-GaN layer. The exposed n-GaN layer will be connected to power through an electrical TSV of the LED emitter substrate. Detailed structure of a vertical LED die bonded to a LED emitter substrate that is bonded with thermoelectric elements will be discussed in FIG. 2.

For a face-up GaN LED die, bonding to the LED emitter substrate may be through the growth substrate. Contrary to the vertical GaN LED die, bonding of the face-up LED die to the secondary surface metal plating of the LED emitter substrate does not electrically connect the p-GaN layer. Instead, electrical access to the p-GaN layer and to the n-GaN layer is from the non-bonding side of the LED die Detailed structure of a face-up LED die bonded to a LED emitter substrate that is bonded with thermoelectric elements will be discussed in FIG. 3.

In step 25, the LED die is electrically connected to surface metal plating of electrical TSVs on the LED emitter substrate. In a vertical GaN LED, the p-GaN layer has already been connected to the LED emitter substrate through the secondary surface metal plating used to bond the LED die. Therefore, only the connection to the n-GaN layer needs to be made by connecting an n-contact metal layer of the LED die to a surface metal plating of an electrical TSV. Alternatively, in a face-up GaN LED where contact metallization for both the p-GaN layer and the n-GaN are on the top side of the LED, connection from both an n-GaN contact metallization and the p-contact metal layer are made to surface metal plating of their electrical TSVs. In the present embodiment, electrical connections are made by depositing bonding wires. Alternative embodiments include forming micro-interconnects through a photolithography process. To complete the LED fabrication process, a phosphor coating is deposited on the LED die to change the wavelength of the emitted light. In addition, lens molding is formed on the phosphor coating to further shape an emission pattern of the emitted light.

Figure 2:
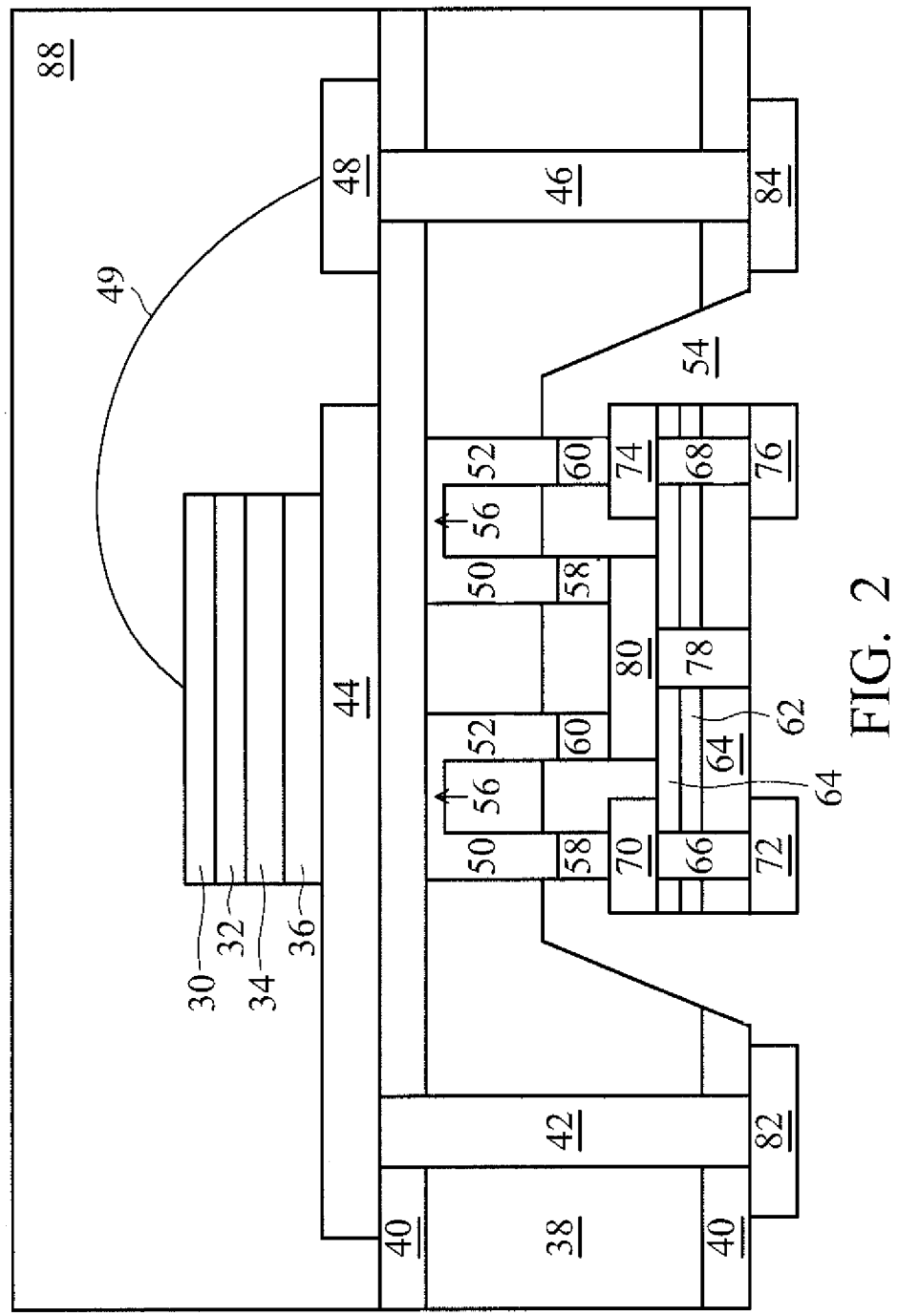
FIG. 2 shows a cross-sectional view of a LED component integrating a vertical LED die with a thermoelectric device using the method of FIG. 1 according to one or more embodiments of the present disclosure.

FIG. 2 shows a cross-sectional view of an LED component integrating a vertical LED die with a thermoelectric device using the method of FIG. 1 according to one or more embodiments of the present disclosure.

The epitaxial layers of the LED die include an n-doped GaN layer 30 or a layer of other n-type semiconductor materials. A multiple quantum well (MQW) active layer 32 is deposited on n-doped GaN layer 30. MQW active layer 32 may include alternating (or periodic) layers of GaN and indium gallium nitride (InGaN). For example, in one embodiment, MQW active layer 32 includes at least 7 alternating layers of GaN and InGaN. A p-doped GaN layer 34 or a layer of other p-type semiconductor materials is deposited on MQW active layer 32. A heavily doped silicon layer 36 is deposited on p-doped GaN layer 34. Heavily doped silicon layer 36 may include metals that have good conductive properties. A P/N junction (or a P/N diode) is essentially formed from MQW active layer 32 being disposed between n-doped GaN layer 30 and p-doped GaN layer 34. When an electrical voltage (or electrical charge) is applied to n-doped GaN layer 30 and p-doped GaN layer 34, electrical current flows through the LED, causing MQW active layer 32 to emit light. The color of the light emitted by MQW active layer 32 is associated with the wavelength of the light, which may be tuned by varying the composition and structure of the materials that make up MQW active layer 32.

The LED emitter substrate includes a silicon substrate 38 layer that is sandwiched between two isolation or dielectric layers 40. Isolation layers 40 include dielectric materials such as $SiO_2$. The LED emitter substrate includes a p-channel electrical TSV 42 disposed through isolation layers 40 and silicon substrate layer 38. P-channel electrical TSV 42 electrically connects to a LED bonding pad 44 disposed on the upward facing surface of isolation layers 40. LED bonding pad 44 includes secondary surface metal plating 121 and surface metal plating 115 as shown in FIGS. 1I and 1N. LED bonding pad 44 and p-channel electrical TSV 42 provide electrical access to p-doped GaN layer 34 through heavily doped silicon layer 36. LED bonding pad 44 also serves as a thermal contact to conduct heat away from the LED die as well as a contact for bonding the LED die to the LED emitter substrate. In addition, LED bonding pad 44 has reflective function or a reflective layer to reflect upward light from MQW active layer 32. LED bonding pad 44 includes metals with good conductive properties, both electrical and thermal, and good bonding property such as gold, gold alloy, copper, copper alloy, nickel, nickel alloy, platinum, platinum alloy, titanium, titanium alloy, or combinations thereof.

The LED emitter substrate also includes an n-channel electrical TSV 46 disposed through isolation layers 40 and silicon substrate layer 38. N-channel electrical TSV 46 electrically connects to an n-contact 48 that is a surface metal plating disposed on the upward facing surface of isolation layers 40. N-contact 48 connects to n-doped GaN layer 30 through an n-contact bonding wire 49. Therefore, n-channel electrical TSV 46, n-contact 48, and n-contact bonding wire 49 provide electrical access to n-doped GaN layer 30.

The LED emitter substrate further includes one or more p-type thermal TSVs 50 and n-type thermal TSVs 52 disposed between the bottom of a cavity 54 on the downward facing surface of the silicon substrate 38 and isolation layers 40. P-type thermal TSVs 50 and n-type thermal TSVs 52 help to channel heat from LED bonding pad 44 to thermoelectric elements disposed in the cavity 54. Metallic interconnects 56 are disposed between adjacent P-type thermal TSVs 50 and n-type thermal TSVs 52 to provide a conductive path for current to flow from n-type thermal TSVs 52 to p-type thermal TSVs 50. P-type thermal TSVs 50 are connected to the cold end of p-type thermoelectric elements 58 disposed on the bottom of cavity 54. Similarly, n-type TSVs 52 are connected to the cold end of n-type thermoelectric elements 60 disposed on the bottom of cavity 54. P-type thermoelectric elements 58 and n-type thermoelectric elements 60 are arranged in an alternating pattern Thermoelectric elements are supported by a thermoelectric substrate disposed in the cavity 54. The thermoelectric substrate has a silicon substrate layer 62 sandwiched between dielectric layers 64, in a structure similar to that of the LED emitter substrate. The thermoelectric substrate also includes a p-type electrical TSV 66 and an n-type electrical TSV 68 patterned to extend through silicon substrate 62 and dielectric layers 64 and disposed close to the outer edges of the thermoelectric substrate. One end of p-type electrical TSV 66 connects to a p-type bonding pad 70 which connects with the hot end of an outermost one of p-type thermoelectric elements 58. The other end of p-type electrical TSV 66 connects to a p-type electrode 72 for supplying power to the thermoelectric elements. Similarly, one end of n-type electrical TSV 68 connects to an n-type bonding pad 74 which connects with the hot end of an outermost one of n-type thermoelectric elements 60. The other end of n-type electrical TSV 68 connects to an n-type electrode 76 for supplying power to the thermoelectric elements.

In addition, the thermoelectric substrate includes a thermal TSV 78 and a thermoelectric interconnect 80. Thermoelectric interconnect 80 connects the hot end of an inner one of p-type thermoelectric elements 58 with the hot end of an inner one of adjacent n-type thermoelectric elements 60 to provide a conductive path for current to flow from p-type thermoelectric elements to n-type thermoelectric elements. Thermoelectric interconnect 80 also connects with thermal TSV 78 to channel heat away from the hot end of the thermoelectric elements. In the present embodiment, thermal TSV 78 relies on convection cooling to dissipate heat to the ambient air near the downward facing surface of the thermal substrate. Alternatively, thermal TSV 78 may be connected to a heat sink.

The network of electrodes, boding pads, TSVs, and interconnects electrically connects the alternating arrangement of p-type thermoelectric elements 58 and n-type thermoelectric elements 60 in series. For example, when a positive voltage is applied to n-type electrode 76 and p-type electrode 72 is tied to ground, current flows from n-type electrode 76 through n-type electrical TSV 68 and through n-type bonding pad 74 to the hot end of the outermost one of n-type thermoelectric elements 60. Current flows from the outermost one of n-type thermoelectric elements 60 to the inner one of p-type thermoelectric elements 58 through a first set of n-type thermal TSVs 52, metallic interconnect 56 and p-type thermal TSVs 50. From the inner one of p-type thermoelectric elements 58, current flow across thermoelectric interconnect 80 to the inner one of n-type thermoelectric elements 60. Current then flows from the inner one of n-type thermoelectric elements 60 to the outermost one of p-type thermoelectric elements 58 through a second set of n-type thermal TSVs 52, metallic interconnect 56 and p-type thermal TSVs 50. Finally, current flows out of the hot end of the outermost one of p-type thermoelectric elements 58 through p-type bonding pad 70, and through p-type electrical TSV 66, to p-type electrode 72 to close the circuit.

Thus, when n-type electrode 76 is positively biased relative to p-type electrode 72, current flows out of the cold end of n-type thermoelectric elements 60 and into the cold end of p-type thermoelectric elements 58. Because the electrons of n-type thermoelectric elements 60 move opposite the direction of the current, electrons in n-type thermoelectric elements 60 move from the cold end to the hot end of n-type thermoelectric elements 60, away from the LED die. Similarly, because the holes of p-type thermoelectric elements 58 move in the direction of the current, holes in p-type thermoelectric elements 58 also move from the cold end to the hot end of p-type thermoelectric elements 58, away from the LED die. Since the direction of the flow of the charge carriers is the direction of heat removal, heat is removed from the LED die and flows from the cold end to the hot end of p-type thermoelectric elements 58 and n-type thermoelectric elements 60. Thermoelectric interconnect 80 connects with hot end of p-type thermoelectric elements 58 and n-type thermoelectric elements 60 to channel heat into thermal TSV 78 and into ambient air on the downward facing surface of the thermoelectric substrate.

P-layer electrode 82 and n-layer electrode 84, which are surface metal plating 117 of electrical TSVs as shown in FIGS. 1G, 1H, 1I, and 1N, are disposed on the downward facing surface of the silicon substrate to connect to external package pins for supplying power to the LED die. For example, power is supplied to p-doped GaN layer 34 through p-layer electrode 82, p-channel electrical TSV 42, LED bonding pad 44, and heavily doped silicon layer 36. Similarly, power is supplied to n-doped GaN layer 30 through n-layer electrode 84, n-channel electrical TSV 46, n-contact 48, and n-contact bonding wire 49. Light from MQW active layer 32 is extracted from the upward side of the LED die. A phosphor coating and a lens molding 88 are deposited on the LED die to shape the spectra and the emission pattern of the vertical LED die.

Figure 3:
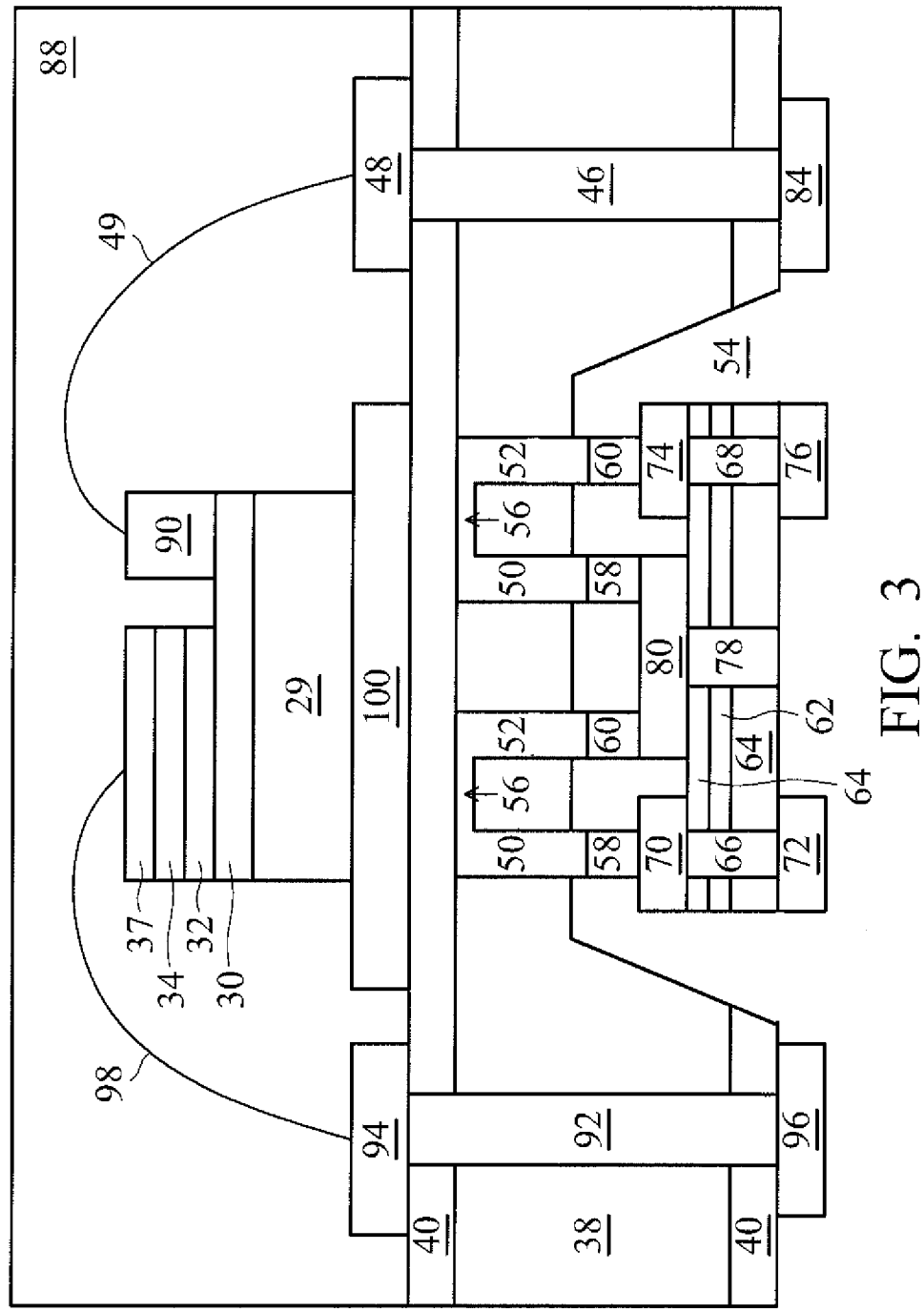
FIG. 3 shows a cross-sectional view of a LED component integrating a face-up LED die with a thermoelectric device using the method of FIG. 1 according to one or more embodiments of the present disclosure.

FIG. 3 shows a cross-sectional view of a LED component integrating a face-up LED die with a thermoelectric device using the method of FIG. 1 according to one or more embodiments of the present disclosure.

In a face-up GaN LED, contact metallization for the p-doped GaN layer and the n-doped GaN layer are both located on upward top side of the LED. Electrical access to p-doped GaN layer 34 is provided through a p-contact metal layer 37. The LED emitter substrate includes a p-contact 94, a p-channel electrical TSV 92, and a p-layer electrode 96 to supply power to p-doped GaN layer 34 through a p-contact bonding wire 98 and p-contact metal layer 37. P-contact 94 is surface metal plating 115 of electrical TSVs shown in FIGS. 1G and 1H. Similarly, P-layer electrode 96 is surface metal plating 117 of electrical TSVs shown in FIGS. 1G and 1H.

Similar to the vertical LED, the LED emitter substrate has an n-contact 48, an n-channel electrical TSV 46, and an n-layer electrode 84 for supplying power to n-doped GaN layer 30 through an n-contact bonding wire 49. However, unlike the vertical LED, portions of the p-doped GaN layer 34 and MQW active layer 32 are etched to form an n-contact metallization 90 to provide electrical access to n-doped GaN layer 30. Therefore, the LED emitter substrate includes an n-contact 48, an n-channel electrical TSV 46, and an n-layer electrode 84 of the LED emitter substrate to supply power to n-doped GaN layer 30 through an n-contact bonding wire 49 and n-contact metallization 90.

A growth substrate 29 of the face-up LED die is bonded to the LED emitter substrate through a bonding pad 100 that also serves as a thermal contact to conduct heat away from the LED die. LED bonding pad 100 may include secondary surface metal plating 121 as shown in FIGS. 1I and 1N. In addition, LED bonding pad 100 has a reflective function or a reflective layer to reflect upward light from MQW active layer 32.

Similar to the vertical LED, the silicon substrate, the LED emitter substrate includes p-type thermal TSVs 50 and n-type thermal TSVs 52 connected respectively to the cold end of p-type thermoelectric elements 58 and n-type thermoelectric elements 60 disposed in an alternating arrangement on the bottom of a cavity 54. Also similar to the vertical LED, the hot end of p-type thermoelectric elements 58 and n-type thermoelectric elements 60 connect with a thermoelectric substrate. The thermoelectric substrate has a network of electrodes, boding pads, TSVs, and interconnects to electrically connect the alternating p-type thermoelectric elements 58 and n-type thermoelectric elements 60 in series. Therefore, when a positive voltage is applied to n-type electrode 76 relative to a p-type electrode 72, heat is removed from the LED die and flows from the cold end to the hot end of p-type thermoelectric elements 58 and n-type thermoelectric elements 60.

In accordance with one or more embodiments of the present disclosure, a light emitting diode (LED) component is disclosed. The LED component includes an LED emitter substrate having an upward facing surface and a downward facing surface. The LED emitter substrate has a cavity in the downward facing surface of the LED emitter substrate and thermal vias that extend from a bottom of the cavity to an area close to an upward facing surface of the LED emitter substrate. The LED component also includes thermoelectric elements disposed in the cavity. The thermoelectric elements connect with their corresponding thermal vias of the LED emitter substrate. The device further includes a thermoelectric substrate in the cavity. The thermoelectric substrate has electrical vias and bonding pads to electrically connect to the thermoelectric elements. The device further includes an LED die having doped layers positioned on the upward facing surface of the LED emitter.

In accordance with one or more embodiments of the present disclosure, a light emitting diode (LED) component is disclosed. The LED component has a downward facing surface and an upward facing surface. The LED component includes a cavity in the downward facing surface of the LED component. The LED component also includes thermal vias extending from a bottom of the cavity to an area close to an upward facing surface of the LED component. The LED component further includes an LED die disposed on the upward facing surface. The LED component further includes thermoelectric elements in the cavity. The thermoelectric elements connect with the thermal vias such that a direction of flow of charge carriers of the thermoelectric elements is away from the LED die to remove heat from the LED die.

In accordance with one or more embodiments of the present disclosure, a method for fabricating a light emitting diode (LED) component is disclosed. The method includes providing an LED emitter substrate of a first semiconductor material. The LED emitter substrate has a downward facing surface and an upward facing surface. The method also includes etching a cavity in the downward facing surface of the LED emitter substrate. The method further includes patterning thermal vias in the LED emitter substrate such that the thermal vias extend from a bottom of the cavity to an area close to an upward facing surface of the LED emitter substrate. The method further includes providing a thermoelectric substrate of a second semiconductor material. The method further includes patterning vias in the thermoelectric substrate. The method further includes bonding thermoelectric elements to the vias in the thermoelectric substrate. The method further includes bonding the thermoelectric elements to the vias in the LED emitter substrate from inside the cavity. The method further includes bonding an LED die to the upward facing surface of the LED emitter substrate such that the LED die is opposite the cavity in the LED emitter substrate.

Although embodiments of the present disclosure have been described, these embodiments illustrate but do not limit the disclosure. It should also be understood that embodiments of the present disclosure should not be limited to these embodiments but that numerous modifications and variations may be made by one of ordinary skill in the art in accordance with the principles of the present disclosure and be included within the spirit and scope of the present disclosure as hereinafter claimed.

What is claimed is:

1. A light emitting diode (LED) component comprising:
   an LED emitter substrate having an upward facing surface and a downward facing surface, the LED emitter substrate including a cavity in the downward facing surface of the LED emitter substrate and a plurality of thermal vias extending from a bottom of the cavity to an area close to the upward facing surface of the LED emitter substrate;
   a plurality of thermoelectric elements disposed in the cavity, wherein each of the plurality of thermoelectric elements is connected to a corresponding one of the plurality of thermal vias;
   a thermoelectric substrate disposed in the cavity, wherein the thermoelectric substrate is disposed with a plurality of electrical vias and bonding pads to electrically connect the plurality of thermoelectric elements; and
   an LED die disposed on the upward facing surface of the LED emitter substrate, wherein the LED die includes a plurality of doped layers.

2. The LED component of claim 1, wherein the LED emitter substrate further comprises an isolation layer disposed on the upward facing surface of the LED emitter substrate and wherein the plurality of thermal vias extend from the bottom of the cavity to the isolation layer.

3. The LED component of claim 1, wherein the LED emitter substrate further comprises a metallic interconnect disposed to connect a first thermal via to an adjacent second thermal via.

4. The LED component of claim 1, wherein the plurality of thermoelectric elements comprises an alternating arrangement of p-type semiconductor thermoelectric elements and n-type semiconductor thermoelectric elements so that the number of p-type semiconductor thermoelectric elements is the same as the number of n-type semiconductor thermoelectric elements.

5. The LED component of claim 4, wherein one of the p-type semiconductor thermoelectric elements is connected to an adjacent one of the n-type semiconductor thermoelectric elements through their corresponding thermal vias and a metallic interconnect disposed in the LED emitter substrate to connect the corresponding thermal vias.

6. The LED component of claim 5, wherein the plurality of electrical vas and bonding pads of the thermoelectric substrate in conjunction with the thermal vias and one or more of the metallic interconnect of the LED emitter substrate are disposed to electrically connect in series the alternating arrangement of p-type semiconductor thermoelectric elements and n-type semiconductor thermoelectric elements.

7. The LED component of claim 5, wherein if one of the p-type semiconductor thermoelectric elements is adjacent to two of the n-type semiconductor thermoelectric elements, then the p-type semiconductor thermoelectric element is connected to a first adjacent n-type semiconductor thermoelectric element through their corresponding thermal vias and the metallic interconnect between the thermal vias in the LED emitter substrate, and the p-type semiconductor thermoelectric element is connected to a second adjacent n-type semiconductor thermoelectric element through one of the bonding pads of the thermoelectric substrate.

8. The LED component of claim 4, wherein the thermoelectric substrate further comprises one or more thermoelectric interconnects to connect one of the p-type semiconductor thermoelectric elements to an adjacent one of the n-type semiconductor thermoelectric elements.

9. The LED component of claim 8, wherein the thermoelectric substrate further comprises one or more thermal vias connected to a corresponding one of the metallic interconnects to channel heart away from the plurality of thermoelectric elements toward a downward facing surface of the thermoelectric substrate.

10. The LED component of claim 1, wherein the thermoelectric substrate further comprises:
    a first one of the plurality of electrical vias disposed to extend through the thermoelectric substrate to connect an outermost one of the p-type semiconductor thermoelectric elements to a first electrode; and;
    a second one of the electrical vias disposed to extend through the thermoelectric substrate to connect an outermost one of the n-type semiconductor thermoelectric elements to a second electrode.

11. The LED component of claim 1, further comprising a bonding pad disposed on the upward facing surface of the LED emitter substrate opposite the cavity to bond the LED die to the LED emitter substrate.

12. The LED component of claim 11, where in the bonding pad electrically connects power to one of the doped layers of the LED die.

13. The LED component of claim 11, wherein the bonding pad further comprises a reflective layer to reflect light emitted from the LED die upward.

14. The LED component of claim 1, further comprising a contact disposed on the upward facing surface of the LED emitter substrate to connect power to one of the doped layers of the LED die.

15. A light emitting diode (LED) component having a downward facing surface and an upward facing surface, the LED component comprising:
 a cavity in the downward facing surface of the LED component and a plurality of thermal vias extending from a bottom of the cavity to an area close to the upward facing surface of the LED component;
 an LED die disposed on the upward facing surface of the LED component; and
 a plurality of thermoelectric elements disposed in the cavity to connect with the plurality of thermal vias, wherein a direction of flow of charge carriers of the plurality of thermoelectric elements is away from the LED die to remove heat from the LED die.

16. The LED component of claim 15, wherein the plurality of thermoelectric elements comprises an alternating arrangement of p-type semiconductor thermoelectric elements and n-type semiconductor thermoelectric elements so that the number of p-type semiconductor thermoelectric elements is the same as the number of n-type semiconductor thermoelectric elements.

17. The LED component of claim 16, wherein the alternating arrangement of p-type semiconductor thermoelectric elements and n-type semiconductor thermoelectric elements are electrically connected in series.

18. The LED component of claim 17, wherein an end of each of the plurality of thermoelectric elements closer to the LED die is the cold end, and wherein the cold end of one of the n-type semiconductor thermoelectric elements is connected to the cold end of an adjacent one of the p-type semiconductor thermoelectric elements.

19. The LED component of claim 17, wherein an end of each of the plurality of thermoelectric elements farther from the LED die is the hot end, and wherein the hot end of one of the p-type semiconductor thermoelectric elements is connected to the hot end of an adjacent one of the n-type semiconductor thermoelectric elements.

20. A light emitting diode (LED) component, comprising:
 an LED emitter substrate of a first semiconductor material, the LED emitter substrate having a downward facing surface and an upward facing surface;
 a cavity disposed in the downward facing surface of the LED emitter substrate;
 a plurality of first vias disposed in the LED emitter substrate, the first vias extending from a bottom of the cavity to an area close to the upward facing surface of the LED emitter substrate;
 a thermoelectric substrate of a second semiconductor material, the thermoelectric substrate having a plurality of second vias, wherein the thermoelectric substrate is bonded to the LED emitter through the first vias and second vias; and
 an LED die bonded to the upward facing surface of the LED emitter substrate opposite the cavity.

\* \* \* \* \*